United States Patent
Cho

(10) Patent No.: US 8,228,266 B2
(45) Date of Patent: Jul. 24, 2012

(54) ACTIVE-MATRIX ORGANIC ELECTROLUMINESCENT DEVICE AND METHOD FOR FABRICATING THE SAME

(75) Inventor: Bong Rae Cho, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 762 days.

(21) Appl. No.: 11/819,129

(22) Filed: Jun. 25, 2007

(65) Prior Publication Data

US 2008/0122373 A1    May 29, 2008

(30) Foreign Application Priority Data

Jun. 26, 2006    (KR) .................. 10-2006-0057197

(51) Int. Cl.
*G09G 3/30* (2006.01)
(52) U.S. Cl. .................... 345/76; 455/24; 315/169.3
(58) Field of Classification Search .............. 345/76–83, 345/204; 315/169.3; 313/483, 506; 438/634, 438/740, 155, 158, 159, 584, 674; 455/24; 257/E21.133, E21.134, 59
See application file for complete search history.

(56) References Cited

U.S. PATENT DOCUMENTS

| | | | |
|---|---|---|---|
| 5,432,108 A * | 7/1995 | Lee | 438/157 |
| 6,388,386 B1 * | 5/2002 | Kunii et al. | 315/169.3 |
| 7,547,567 B2 * | 6/2009 | Moriya et al. | 438/30 |
| 2002/0047579 A1 * | 4/2002 | Kunii et al. | 315/169.3 |
| 2002/0047580 A1 * | 4/2002 | Kunii et al. | 315/169.3 |
| 2005/0087769 A1 * | 4/2005 | Yamazaki et al. | 257/202 |
| 2006/0061526 A1 * | 3/2006 | Shirasaki et al. | 345/77 |

* cited by examiner

*Primary Examiner* — Stephen Sherman
(74) *Attorney, Agent, or Firm* — McKenna Long & Aldridge LLP

(57) ABSTRACT

An organic electroluminescent device is provided. A gate line and a data line cross each other to define a pixel region, and a power line crosses the gate line and is arranged parallel to the data line. A switching transistor is disposed at a crossing of the gate line and the data line, a driving transistor is disposed at a crossing of the gate line and the power line, and a pixel electrode is formed in the pixel region. Each of the switching transistor and the driving transistor includes a gate electrode formed under a channel layer, and a stopper on the channel layer.

26 Claims, 5 Drawing Sheets

<Ts Region>

Normal Output Characteristic

Normal Output Characteristic

ACTIVE-MATRIX ORGANIC ELECTROLUMINESCENT DEVICE AND METHOD FOR FABRICATING THE SAME

This application claims the benefit of Korean Patent Application No. 10-2006-0057197, filed on Jun. 26, 2006, which is hereby incorporated by reference for all purposes as if fully set forth herein.

BACKGROUND OF THE INVENTION

1. Field of the Invention

The present invention relates to an organic electroluminescent device, and more particularly, to an active-matrix organic electroluminescent device for improving a device characteristic while protecting a channel layer of a thin film transistor.

2. Description of the Related Art

A self-luminous organic electroluminescent device, one of new flat panel display devices, has advantages of an excellent viewing angle characteristic and a high contrast ratio, compared to a liquid crystal display device. Also, the self-luminous organic electroluminescent device can be manufactured in lightweight, have a slim profile, and consume low power because a backlight is unnecessary. Advantageously, the organic electroluminescent device can be driven by a low DC voltage, has a fast response time, and is formed entirely of a solid. Therefore, the organic electroluminescent device is strongly resistant to an external impact, has a wide operating temperature range, and particularly, is cheap to manufacture.

FIG. 1 is a cross-sectional view illustrating a thin film transistor of a related art organic electroluminescent device.

As illustrated in FIG. 1, the thin film transistor used for an organic electroluminescent device includes a gate electrode 21 on a channel layer 14 of polysilicon, and a source electrode 16a and a drain electrode 16b on the channel layer 14 have a coplanar structure around the channel layer 14.

A buffer layer 11 is formed on an insulating substrate 10, and the channel layer 14 is formed on the buffer layer 11. The channel layer 14 is formed by forming amorphous silicon on the buffer layer 11, and polycrystallizing the amorphous silicon through a heat treatment using a laser.

Ohmic contact layers 15a and 15b are respectively formed at portions of the channel layer 14 contacting the source electrode 16a and the drain electrode 16b through n+ or p+ ion implantation.

A gate insulating layer 13 is formed on the channel layer 14. A storage electrode 23 for forming storage capacitance in cooperation with the gate electrode 21 is formed on the gate insulating layer 13.

The gate electrode 21 is formed on a portion of the channel layer 14 that is located between the ohmic contact layers 15a and 15b of the channel layer 14.

An interlayer insulating layer 17 is formed on the gate electrode 21. The source electrode 16a and the drain electrode 16b electrically contacting the ohmic contact layers 15a and 15b, respectively, are formed in the interlayer insulating layer 17. A pixel electrode 19 electrically contacts the drain electrode 16b.

Thereafter, an organic electroluminescent body is formed on the pixel electrode 19. That is, the pixel electrode 19 serves as an anode or a cathode of the organic electroluminescent body in a pixel region.

However, the related art organic electroluminescent device has the following problems.

In the case of a bottom emission type organic electroluminescent device, the channel layer 14 is exposed to external light, which causes a device characteristic of the thin film transistor to change due to light energy.

This is because the external light is emitted directly onto the channel layer 14 from the outside of the insulating substrate 10, and holes or electrons included in the channel layer 14 receiving light energy have an influence on the characteristic of the thin film transistor.

To prevent the above problem, a light blocking pattern must be additionally formed to prevent exposure of the channel layer 14 to external light, which makes a fabrication process complicated.

SUMMARY OF THE INVENTION

Accordingly, the present invention is directed to an active-matrix organic electroluminescent device and a method for fabricating the same that substantially obviate one or more problems due to limitations and disadvantages of the related art.

An object of the present invention is to provide an active-matrix organic electroluminescent device and a method for fabricating the same capable of protecting a channel layer without an additional process by forming a thin film transistor into a bottom gate structure and forming a stopper on a gate electrode when an anode is formed.

Another object of the present invention is to provide an active-matrix organic electroluminescent device and a method for fabricating the same capable of minimizing a device characteristic change (a kink effect) using a back bias by connecting a stopper formed on a gate electrode to a source electrode.

Further another object of the present invention is to provide an active-matrix organic electroluminescent device and a method for fabricating the same capable of forming sufficient storage capacitance by using a gate insulating layer and a channel layer between a storage electrode and a drain electrode.

Still further another object of the present invention is to provide an active-matrix organic electroluminescent device and a method for fabricating the same capable of protecting a channel layer by forming a metal layer and a stopper of an indium tin oxide electrode (anode of an organic electroluminescent body) when a top-emission type organic electroluminescent device is used.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic electroluminescent device including: a gate line and a data line crossing each other to define a pixel region; a power line crossing the gate line and arranged parallel to the data line; a switching transistor disposed at a crossing of the gate line and the data line; a driving transistor disposed at a crossing of the gate line and the power line; and a pixel electrode formed in the pixel region. Each of the switching transistor and the driving transistor includes a gate electrode formed under a channel layer, and a stopper on the channel layer.

In another aspect of the present invention, there is provided a method for fabricating an organic electroluminescent device, including: forming a gate electrode and a storage electrode on a substrate; forming a gate insulating layer and a channel layer on the gate electrode and the storage electrode; forming an interlayer insulating layer and a transparent metal sequentially on the substrate including the channel layer, and etching the resulting structure to form a pixel electrode and a stopper; and forming a source/drain electrode, a data line and a power line on the substrate including the stopper.

In further another aspect of the present invention, there is provided a method for fabricating an organic electroluminescent device, including: forming a first gate electrode, a second gate electrode, and a storage electrode on a substrate; forming a gate insulating layer and a channel layer on the first and second gate electrodes and the storage electrode; forming an interlayer insulating layer and a transparent metal sequentially on the substrate including the channel layer, and etching the resulting structure to form a pixel electrode and first and second stoppers; and forming first source/drain electrodes corresponding to the first gate electrode, second source/drain electrodes corresponding to the second gate electrode, a data line, and a power line on the substrate including the first and second stoppers.

It is to be understood that both the foregoing general description and the following detailed description of the present invention are exemplary and explanatory and are intended to provide further explanation of the invention as claimed.

DETAILED DESCRIPTION OF THE INVENTION

Reference will now be made in detail to the preferred embodiments of the present invention, examples of which are illustrated in the accompanying drawings. The invention may, however, be embodied in many different forms and should not be construed as being limited to the embodiments set forth herein.

Figure 1:
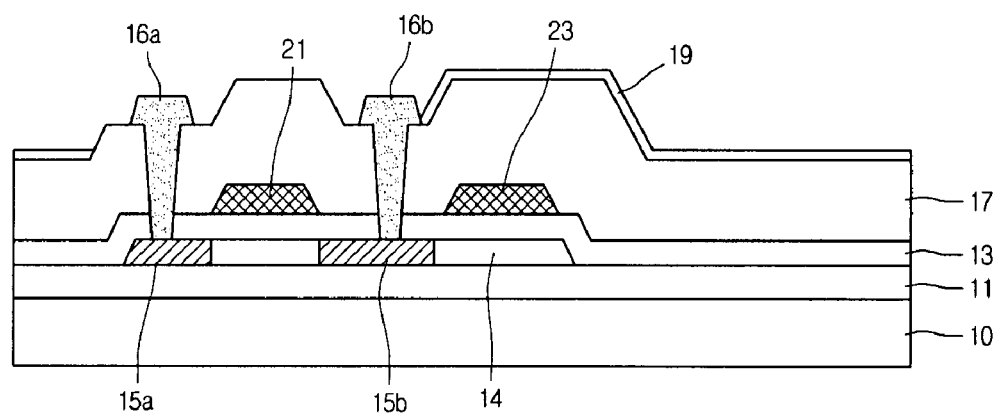
FIG. 1 is a cross-sectional view illustrating a thin film transistor structure of a related art organic electroluminescent device.
Figure 2:
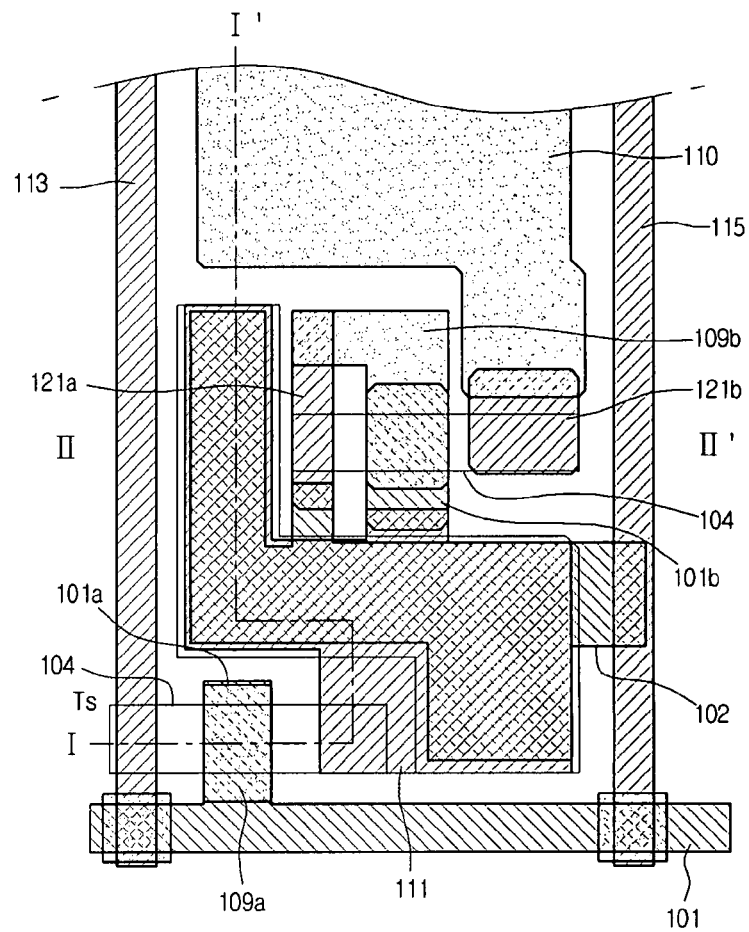
FIG. 2 is a view illustrating a pixel structure of an organic electroluminescent device according to an embodiment the present invention.

FIG. 2 illustrates a pixel of an organic electroluminescent device according to an embodiment of the present invention.

Referring to FIG. 2, a pixel of the organic electroluminescent device includes a data line 113 and a gate line 101 crossing each other to define a unit pixel region, and a power line 115 facing the data line 113 and supplying power to a driving transistor Td.

A switching transistor Ts is formed at a crossing of the data line 113 and the gate line 101. The switching transistor Ts applies a data signal transmitted from the data line 113 to the driving transistor Td to control an output current of the driving transistor Td.

The switching transistor Ts includes a first gate electrode 101a branching from the gate line 101, a channel layer 104 formed on the gate electrode 101a, and a first source electrode 113 and a first drain electrode 111 formed at both sides of the channel layer 104, respectively.

In the drawing, the data line 113 serves as the first source electrode.

A storage electrode 102 is formed under the first drain electrode 111, and electrically connected to the power line 115. Thus, the storage electrode 102 forms storage capacitance in cooperation with the first drain electrode 111.

Also, a first stopper 109a is formed on the first gate electrode 101a of the switching transistor Ts to form an ohmic contact layer at the switching transistor Ts without an additional mask process.

Also, the first drain electrode 111 is electrically connected to a second gate electrode 101b of the driving transistor Td, and a second source electrode 121a of the driving transistor Td is electrically connected to the storage electrode 102 to receive a current transmitted from the power line 115.

The second drain electrode 121b of the driving transistor Td faces the second source electrode 121a, and electrically contacts a pixel electrode 110.

Therefore, a width of the channel layer 104 of the driving transistor Td through which electrons or holes move is controlled by a data signal transmitted to the first drain electrode 111, so that a current is transmitted from the second source electrode 121a to the second drain electrode 121b and the pixel electrode 110.

The channel layer 104 is formed on the second gate electrode 101b, and a second stopper 109b for forming an ohmic contact layer is formed on the channel layer 104. The second stopper 109b is electrically connected to the second source electrode 121a so that a back bias is applied to the driving transistor Td.

Since the first gate electrode 101a and the second gate electrode 101b are formed under the channel layer 104 of the switching transistor Ts and the driving transistor Td, the channel layer 104 can be protected from external light.

Figure 3A:
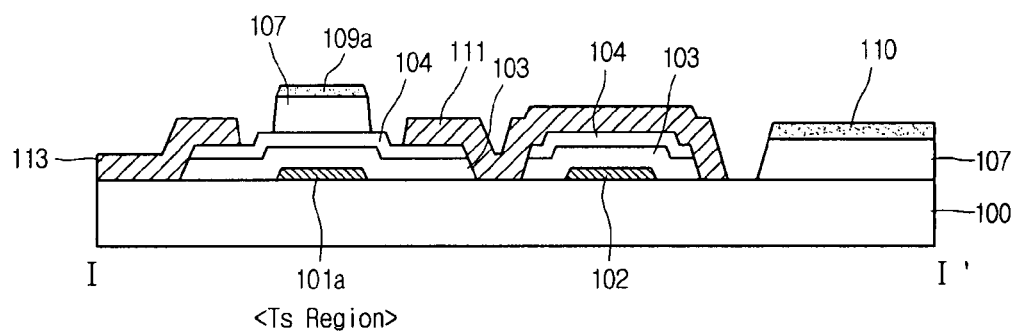
FIG. 3A is a cross-sectional view taken along line I-I' of FIG. 2.
Figure 3B:
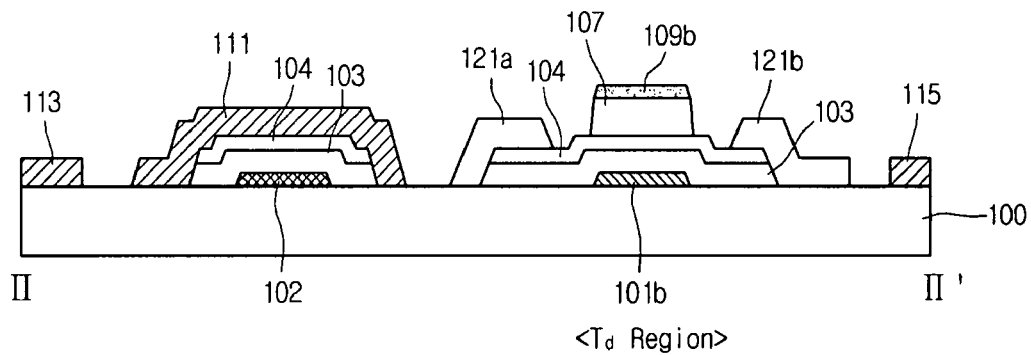
FIG. 3B is a cross-sectional view taken along line II-II' of FIG. 2.

FIG. 3A is a cross-sectional view taken along line I-I' of FIG. 2, and FIG. 3B is a cross-sectional taken along line II-II' of FIG. 2.

As illustrated in FIGS. 3A and 3B, the first gate electrode 101a of the switching transistor Ts and the second gate electrode 101b of the driving transistor Td are formed on the insulating substrate 100. At this time, the storage electrode 102 for formation of storage capacitance is also formed on the insulating substrate 100.

As for a Ts region of FIG. 3A, the gate insulating layer 103 and the channel layer 104 of polysilicon are formed on the first gate electrode 101a. The interlayer insulating layer 107 and the first stopper 109a are formed on a portion of the channel layer 10 corresponding to the first gate electrode 10a.

The data line 113 and the first drain electrode 111 are formed at left and right sides of the first stopper 109a. Here, the data line 113 is formed on the channel layer 104 and serves as a first source electrode, and the first drain electrode 111 faces the data line 113. The first drain electrode 111 extends to overlap the storage electrode 102, thereby forming the storage capacitance.

The gate insulating layer 103 and the channel layer 104 are formed between the storage electrode 102 and the first drain electrode 111.

The pixel electrode 110 is formed on the interlayer insulating layer 107 in a region adjacent to the storage electrode 102.

That is, the transistor has a bottom gate structure, and the first stopper 109a is formed of an indium tin oxide material on the first gate electrode 101a when the pixel electrode 110 is formed, so that an ohmic contact layer can be formed on the channel layer 104 without an additional mask process.

In a Td region of FIG. 3B, the gate insulating layer 103 and the channel layer 104 are formed on the second gate electrode 101b, and the interlayer insulating layer 17 and the second stopper 109b are formed on the channel layer 104.

The second source electrode 121a and the second drain electrode 121b are formed at both sides of the second stopper 109b, and the power line 115 is formed at a region adjacent to the second drain electrode 121b.

In a storage capacitance region, as illustrated in FIG. 3B, the first drain electrode 111 and the storage electrode 102 form storage capacitance, with the gate insulating layer 103 and the channel layer 104 interposed therebetween.

Referring to FIG. 2, since the second stopper 109b formed at the driving transistor Td is electrically connected to the second source electrode 121a, the second stopper 109b is back-biased.

Accordingly, a kink effect can be prevented from occurring at an output of the driving transistor Td.

Figure 4A:
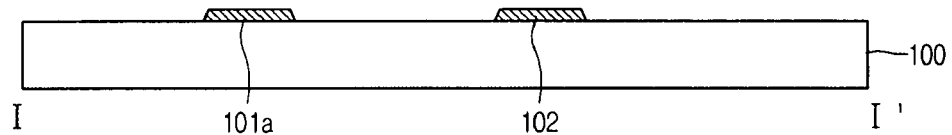
FIGS. 4A through 4C are cross-sectional views taken along a line I-I' of FIG. 2, explaining a process for fabricating an organic electroluminescent device according to an embodiment of the present invention.
Figure 4B:
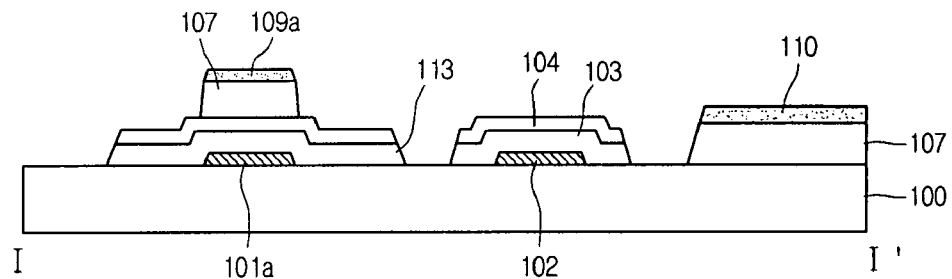
Figure 4C:
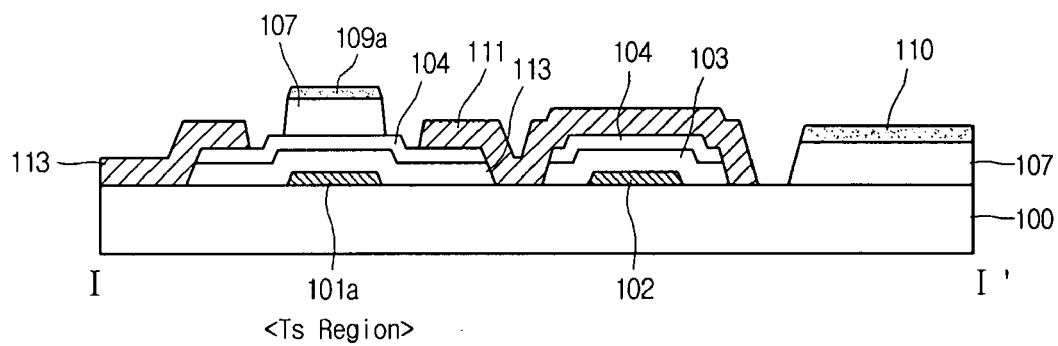

FIGS. 4A through 4c are cross-sectional views taken along line I-I' of FIG. 2, illustrating a fabrication process of an organic electroluminescent device according to an embodiment of the present invention.

As illustrated in FIGS. 4A through 4C, a metal layer is formed on an insulating substrate 100, and then is patterned to form a first gate electrode 101a and a storage electrode 102.

When the first gate electrode 101a is formed, a second gate electrode (not shown) is formed in a driving transistor region. Also, aluminum (Al), AlNd, or Cu may be used for the gate electrode.

Referring to FIG. 4B, after the first gate electrode 101a and the storage electrode 102 are formed on the insulating substrate 100, a gate insulating layer and an amorphous silicon layer are formed on an entire surface of the insulating substrate 100, and the amorphous silicon layer is polycrystallized using a laser.

When the polysilicon layer is formed, a mask process is performed thereon for patterning to form a gate insulating layer 103 and a channel layer 104.

After the channel layer 104 is formed on the insulating substrate 100, an interlayer insulating layer 107 and an indium tin oxide metal are formed on an entire surface of the insulating substrate 100.

Then, the indium tin oxide metal is patterned to form a pixel electrode 110 in a pixel region and a first stopper 109a on the channel layer 104. Thereafter, the interlayer insulating layer 107 is continuously etched without removing the patterned photoresist.

Thus, the interlayer insulating layer 107 and the first stopper 109a are formed on the channel layer 104, and the pixel electrode 110 is formed in the pixel region.

Here, a second stopper is formed in a driving transistor region, and the patterning is performed to connect the second stopper electrically to a source electrode of the driving transistor.

After the first stopper 109a of the switching transistor, and the second stopper (not shown) of the driving transistor are formed, an ion implantation process is performed on the channel layer 104 using the first and second stoppers as a mask, thereby forming an ohmic contact layer.

Referring to FIG. 4C, when the ohmic contact layer is formed on the channel layer 104, a metal layer is formed on an entire surface of the insulating substrate 100, and is patterned to form a data line 113 serving as a first source electrode of the switching transistor, and a first drain electrode 111.

The first drain electrode 111 extends to overlap the storage electrode 102, thereby forming storage capacitance with the storage electrode 102.

As described above, in the present invention, the first gate electrode 101a and the second gate electrode 101b are formed under the channel layer 10 of the switching transistor and the driving transistor, respectively, so that the channel layer 104 can be protected from external light.

Since the stoppers for formation of the ohmic contact layer are formed simultaneously when the pixel electrode is formed, an ion implantation process can be performed without an additional mask process.

The organic electroluminescent device according to the present invention can ensure a sufficient storage capacitance because the storage capacitance is formed between the drain electrode and the storage electrode of the switching transistor, with the gate insulating layer and the channel layer interposed therebetween.

Figure 5:
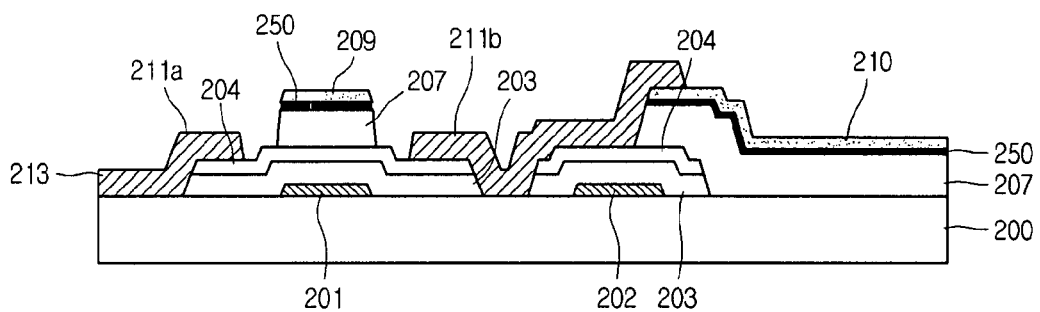
FIG. 5 is a view illustrating a structure of an organic electroluminescent device according to another embodiment of the present invention.

FIG. 5 illustrates a structure of an organic electroluminescent device according to another embodiment of the present invention.

As illustrated in FIG. 5, a driving transistor Td is formed on an insulating substrate 200. A switching transistor Ts is formed together with the driving transistor Td, but the detailed description thereof will be omitted.

A gate electrode 201 and a storage electrode 202 are formed on the insulating substrate 200, and a gate insulating layer 203 and a channel layer 204 of polysilicon are formed on the gate electrode 201. An interlayer insulating layer 207, a metal layer 250 and a stopper 209 are formed on the channel layer 204 corresponding to the gate electrode 201.

In the case where the present invention is applied to a top emission type organic electroluminescent device, the metal layer 250 is formed between the stopper 209 and the interlayer insulating layer 207 to prevent light from being emitted onto the channel layer 104 through the stopper 209 of an indium tin oxide metal.

A pixel electrode 210 is formed at a region adjacent to the storage electrode 202. Since the metal layer 250 is formed between the pixel electrode 210 and the interlayer insulating layer 207, light does not leak toward the pixel electrode 210 at the time of top emission.

Although not shown, a metal layer is formed between a stopper and the interlayer insulating layer in a switching transistor region, so that light generated at the time of top emission is not emitted onto the channel layer of the switching transistor.

After the pixel electrode 210 is formed, a source electrode 211a, a drain electrode 211b, and a data line 213 are formed in a region of the channel layer 204 of the driving transistor. The stopper 209 formed at the driving transistor is electrically connected to the source electrode 211a, so that an output characteristic of the driving transistor is not changed.

A method for fabricating the organic electroluminescent device will now be described, still referring to FIG. 5. Unspecified description is the same as description referring to FIGS. 4A through 4C.

The processes of forming the gate electrode 201 and the storage electrode 202 on the insulating substrate 200 and then forming the channel layer 204 are the same as described referring to FIGS. 4A through 4C.

Thereafter, an interlayer insulating layer, a metal layer and an indium tin oxide metal layer are continuously formed on the insulating substrate 200, and are etched to respectively form the interlayer insulating layer 207, the metal layer 250, and the pixel electrode 210 in a pixel region and the stopper 209 in a transistor region.

Since the indium tin oxide metal layer, the metal layer and the interlayer insulating layer are simultaneously etched, the metal layer 250 that can protect the channel layer 204 from external light is formed between the stopper 209 and the interlayer insulating layer 207.

After the pixel electrode 210 and the stopper 250 are formed, a metal layer is formed on the insulating substrate 200, and is etched to form the source electrode 211a and the drain electrode 211b on the channel layer 204. Here, the source electrode 211a and the stopper 209 are electrically connected together, so that a back bias is applied to the driving transistor, and thus an output current fluctuation does not occur.

The drain electrode 221b overlaps the storage electrode 202 to form storage capacitance with the storage electrode 202.

When the source electrode 211a and the drain electrode 211b are formed, the data line 213 and a power line (not shown) supplying power to the driving transistor are formed at the same time.

The organic electroluminescent device fabricated in the above manner can protect the channel layer 204 without requiring an additional mask process even in the case of a top emission type. Also, since a back bias is applied to the driving transistor, a characteristic change of the transistor can be minimized.

The channel layer 204 of the organic electroluminescent device according to the present invention is protected from external light by the gate electrode under the channel layer 204, and also from light by the metal layer 250 formed between the stopper 209 and the interlayer insulating layer 207.

Figure 6A:
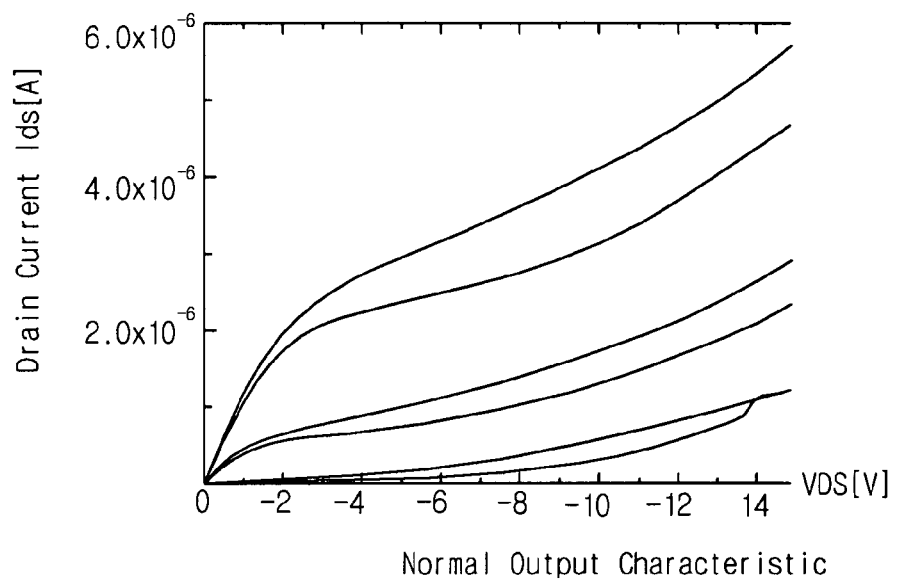
FIG. 6A is a graph showing a characteristic of a current output from a drain electrode region of a related art organic electroluminescent device.
Figure 6B:
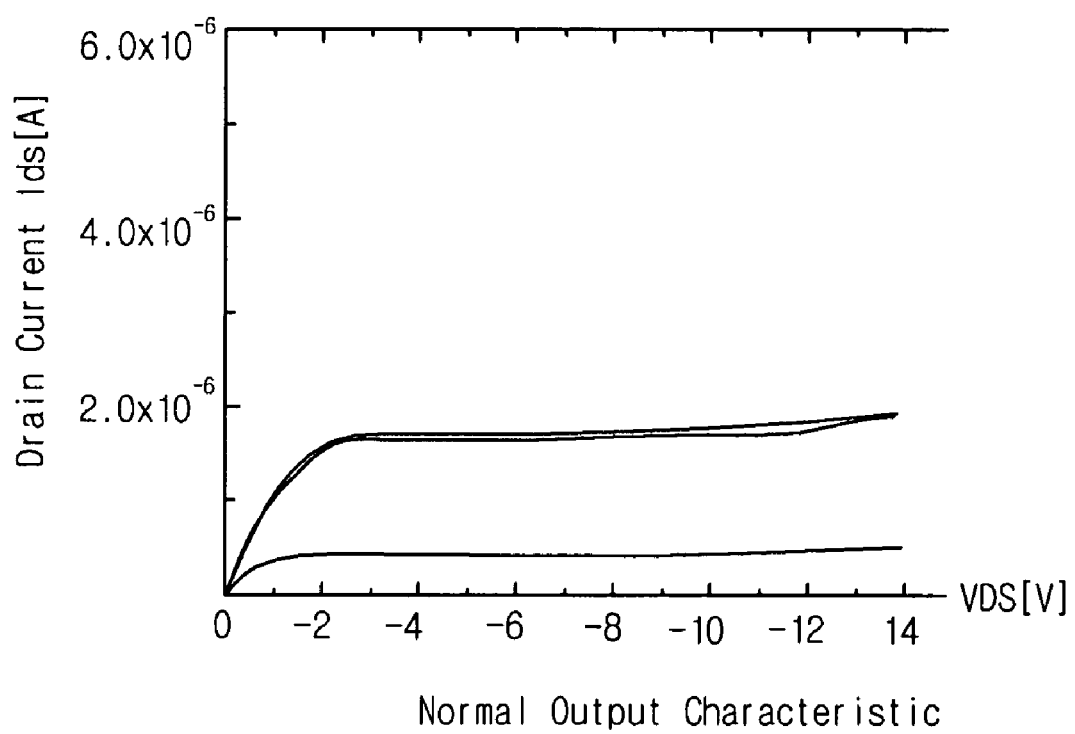
FIG. 6B is a graph showing a characteristic of a current output from a drain electrode region of an organic electroluminescent device according to the present invention.

FIG. 6A is a graph illustrating a characteristic of a current output from a drain electrode region of a related art organic electroluminescent device, and FIG. 6B is a graph illustrating a characteristic of a current output from a drain electrode region of an organic electroluminescent device according to the present invention.

As shown in FIG. 6A, a current output to the drain electrode region is not constant because no back bias is applied to a channel layer region in a driving transistor of the related art organic electroluminescent device. Also, since the channel layer of the transistor is exposed to external light, a very unstable output characteristic of the driving transistor is caused.

As shown in FIG. 6b, a back bias is applied to a stopper placed on a channel layer of a driving transistor according to the present invention, and thus a current being output to the drain electrode is constant without fluctuation.

That is, since the source electrode is connected to the stopper of the driving transistor, an unstable electric field generated at the channel layer region of the driving transistor is eliminated, and thus the kink effect can be prevented.

Also, the gate electrode is formed under the channel layer region of the organic electroluminescent device according to the present invention. Thus, even in the case where the organic electroluminescent device according to the present invention employs a bottom emission type structure, external light is not emitted to the channel layer, thereby preventing a change in transistor performance. In the case of a top emission type, the gate electrode is formed under the channel layer of the driving transistor, and the metal layer for light blocking is formed in the stopper on the channel layer, so that a characteristic change of the channel layer due to external light or self-emission can be prevented.

Accordingly, the driving transistor according to the present invention can improve an image quality characteristic because of its stable output characteristic.

As described so far in detail, since the thin film transistor has a bottom gate structure, and the stopper is formed on the gate electrode in forming an anode, the channel layer can be protected without an additional process.

Also, in the present invention, since the stopper formed on the gate electrode is electrically connected to the source electrode, a device characteristic change (kink effect) can be minimized by a back bias.

Since the gate insulating layer and the channel layer are used between the storage electrode and the drain electrode, a sufficient storage capacitance can be formed.

When the present invention is used for a top emission type organic electroluminescent device, a metal layer and a stopper of an indium tin oxide (ITO) electrode (anode of an organic electroluminescent body) are formed, thereby protecting the channel layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electroluminescent device comprising:
   a gate line and a data line crossing each other to define a pixel region;
   a power line crossing the gate line and arranged parallel to the data line;
   a switching transistor connected to the gate line and the data line;
   a driving transistor connected to the gate line and the power line; and
   a pixel electrode formed in the pixel region,
   wherein each of the switching transistor and the driving transistor includes:
   a gate electrode formed under a channel layer, source and drain electrodes on and directly contacting the channel layer, an interlayer insulating layer on and in direct contact with the channel layer and only in an area between the source and drain electrodes and a stopper on and in contact with the interlayer insulating layer, and
   wherein the interlayer insulating layer and the stopper are spaced apart from the source and drain electrodes, respectively, between the source electrode and the drain electrode.

2. The device according to claim 1, wherein the stopper of the driving transistor is electrically connected to a source electrode.

3. The device according to claim 1, wherein the gate electrodes of the switching transistor and the driving transistor are respectively placed between ohmic contact layers of the channel layer to block light traveling toward the channel layer.

4. The device according to claim 1, further comprising a first metal layer formed between the stopper and the interlayer insulating layer to block light traveling toward the channel layer.

5. The device according to claim 1, wherein the stopper is formed of the same material as that of the pixel electrode.

6. The device according to claim 5, wherein the stopper is formed of an indium tin oxide metal.

7. The device according to claim 1, wherein the source electrode of the driving transistor overlaps a storage electrode with another interlayer insulating layer and another channel layer.

8. The device according to claim 7, wherein the source electrode is electrically connected to the storage electrode.

9. The device according to claim 1, further comprising a second metal layer formed between the pixel electrode and another interlayer insulating layer to block light traveling toward the channel layer.

10. A method for fabricating an organic electroluminescent device, the method comprising:
    forming a first gate electrode, a second gate electrode, and a storage electrode on a substrate;
    forming a gate insulating layer and first to third channel layers on the first and second gate electrodes and the storage electrode;
    forming an interlayer insulating layer and a transparent metal sequentially on the substrate including the first to third channel layers, and etching the resulting structure to form first and second interlayer insulating patterns, a pixel electrode and first and second stoppers; and
    forming first source/drain electrodes on and in direct contact with the channel layer corresponding to the first gate electrode, second source/drain electrodes on and in direct contact with the channel layer corresponding to the second gate electrode, a data line, and a power line on the substrate including the first and second stoppers,
    wherein the first interlayer insulating pattern is formed on and in direct contact with the first channel layer and only in an area between the first source/drain electrodes, and the first stopper is formed on and in contact with the first interlayer insulating pattern, and
    wherein the first interlayer insulating pattern and the first stopper are spaced apart from the first source/drain electrodes, respectively, between the first source electrode and the first drain electrode.

11. The device according to claim 1, wherein the interlayer insulating layer is formed between the channel layer and the stopper.

12. The device according to claim 1, wherein each of the switching transistor and the driving transistor further includes a gate insulating layer on the gate electrode, wherein the interlayer insulating layer is spaced apart from the gate electrode with the gate insulting layer and the channel layer therebetween.

13. A method for fabricating an organic electroluminescent device, the method comprising:
    forming a gate electrode and a storage electrode on a substrate;
    forming a gate insulating layer and a channel layer on the gate electrode and the storage electrode;
    forming an interlayer insulating layer and a transparent metal sequentially on the substrate including the channel layer, and etching the resulting structure to form an interlayer insulating pattern, a pixel electrode and a stopper; and
    forming source/drain electrodes on and in direct contact with the channel layer, a data line and a power line on the substrate including the stopper,
    wherein the interlayer insulating pattern is formed on and in direct contact with the channel layer and only in an area between the source and drain electrodes, and the stopper is formed on and in contact with the interlayer insulating pattern, and
    wherein the interlayer insulating layer and the stopper are spaced apart from the source and drain electrodes, respectively, between the source electrode and the drain electrode.

14. The method according to claim 13, further comprising performing an ion implantation process using the stopper as a mask for formation of an ohmic contact layer in the channel layer after the forming of the stopper.

15. The method according to claim 13, further comprising forming a metal layer for light blocking between the interlayer insulating layer and the transparent metal.

16. The method according to claim 13, wherein the stopper is formed at a portion of the channel layer corresponding to the gate electrode.

17. The method according to claim 13, wherein the source electrode is electrically connected to the stopper.

18. The method according to claim 13, wherein the stopper is formed of the same material as that of the pixel electrode.

19. The method according to claim 13, wherein the stopper is formed of an indium tin oxide metal.

20. The method according to claim 10, wherein the second interlayer insulating pattern is formed on and in contact with the second channel layer and between the second source electrode and second drain electrode, and the second stopper is formed on and in contact with the second interlayer insulating pattern, and
    wherein the second interlayer insulating pattern and the second stopper are spaced apart from the second source/drain electrodes, respectively, between the second source electrode and the second drain electrode.

21. The method according to claim 10, further comprising performing an ion implantation process using the first and second stoppers as a mask for formation of an ohmic contact layer in the first to second channel layers after the forming of first and second stoppers.

22. The method according to claim 10, further comprising forming a metal layer for light blocking between the interlayer insulating layer and the transparent metal.

23. The method according to claim 10, wherein the first and second stoppers are formed at positions of the first to second channel layers corresponding to the first and second gate electrodes, respectively.

24. The method according to claim 10, wherein the second source electrode is electrically connected to the second stopper.

25. The method according to claim 10, wherein the first and second stoppers are formed of the same material as that of the pixel electrode.

26. The method according to claim 10, wherein the first and second stoppers are formed of an indium tin oxide metal.

* * * * *